(12) United States Patent
Chizevsky (10) Patent No.: US 9,237,002 B2
(45) Date of Patent: Jan. 12, 2016

(54) NULL-GATING SIGNAL DETECTION

(71) Applicant: HBC SOLUTIONS, INC., Englewood, CO (US)

(72) Inventor: William Ty Chizevsky, Morrow, OH (US)

(73) Assignee: Imagine Communications Corp., Frisco, TX (US)

( * ) Notice: Subject to any disclaimer, the term of this patent is extended or adjusted under 35 U.S.C. 154(b) by 66 days.

(21) Appl. No.: 14/168,604

(22) Filed: Jan. 30, 2014

(65) Prior Publication Data

US 2015/0215109 A1    Jul. 30, 2015

(51) Int. Cl.
*H04L 7/00*     (2006.01)
*H04L 7/033*    (2006.01)
*H03M 1/34*     (2006.01)

(52) U.S. Cl.
CPC ............. *H04L 7/0037* (2013.01); *H03M 1/345* (2013.01); *H04L 7/033* (2013.01)

(58) Field of Classification Search
CPC ....... H04L 7/0037; H04L 7/033; H03M 1/345
USPC .......................... 375/355, 356, 358, 359, 354
See application file for complete search history.

(56) References Cited

U.S. PATENT DOCUMENTS

| | | | |
|---|---|---|---|
| 5,491,577 A * | 2/1996 | Gautheron et al. | 398/209 |
| 5,764,706 A * | 6/1998 | Carlin et al. | 375/326 |
| 8,139,666 B2 | 3/2012 | Hung et al. | |
| 8,290,075 B2 * | 10/2012 | Cahn et al. | 375/260 |
| 2002/0159584 A1 * | 10/2002 | Sindalovsky et al. | 379/386 |
| 2008/0175330 A1 * | 7/2008 | Jeon et al. | 375/260 |
| 2009/0036071 A1 * | 2/2009 | Wang et al. | 455/127.1 |
| 2013/0113650 A1 * | 5/2013 | Behbahani et al. | 342/27 |
| 2013/0148763 A1 | 6/2013 | Gunawardena et al. | |
| 2013/0250628 A1 | 9/2013 | Lin et al. | |

FOREIGN PATENT DOCUMENTS

| | | |
|---|---|---|
| EP | 05887041 A1 | 9/1993 |
| EP | 1434403 A | 6/2004 |
| JP | 2000115120 A | 4/2000 |
| WO | WO 2009/025501 A9 | 2/2009 |

OTHER PUBLICATIONS

Flock et al., "Digital Sound Broadcasting to Mobile Receivers", IEEE, vol. 35, No. 3, pp. 493-503, Aug. 1989.*

(Continued)

*Primary Examiner* — Qutbuddin Ghulamali
(74) *Attorney, Agent, or Firm* — Tarolli, Sundheim, Covell & Tummino LLP (57) ABSTRACT

One embodiment includes a circuit system. The system includes a power detector configured to convert an AC signal to a DC signal corresponding to a power amplitude associated with the AC signal. The AC signal can include a periodic signal power null. The system also includes a null-gating circuit comprising a logic switch that is activated to enable sampling of an amplitude of the DC signal and that is deactivated during the periodic signal power null. The system also includes an analog-to-digital converter (ADC) configured to convert the sampled DC signal to a digital signal. The system further includes a processor configured to process the digital signal.

20 Claims, 3 Drawing Sheets

(56) References Cited

OTHER PUBLICATIONS

PCT International Search Report; Applicant: Imagine Communications Corp.; Date of Completion: Mar. 20, 2015; Date of Mailing: Mar. 23, 2015; Authorized Officer: Sung Chul Kang; 3 pp.

PCT Written Opinion of the International Searching Authority; Applicant: Imagine Communications Corp.; Date of Completion: Mar. 20, 2015; Date of Mailing: Mar. 23, 2015; Authorized Officer: Sung Chul Kang; 6 pp.

* cited by examiner

NULL-GATING SIGNAL DETECTION

TECHNICAL FIELD

This disclosure relates generally to network and computer systems, and specifically to null-gating signal detection.

BACKGROUND

Certain modulation schemes can exhibit cyclic (i.e., periodic) power nulls of the waveform. As an example, some types of broadcast modulation schemes, such as Digital Audio Broadcast (DAB), can exhibit the power nulls in the broadcast RF signal. The power nulls can include a fluctuating DC signal at an output of a power detector in an associated receiver. To ascertain the data encoded therein, it is desirable that the fluctuating DC signal be stabilized in some manner. However, some stabilization methods can adversely constrain the response time of the associated power control loop. Other stabilization methods can insert a lag in the system power control response. As a result of existing stabilization methods, an effective system power control loop response time can degrade (e.g., to seconds), which can be inadequate for certain transmitter monitoring and protection functions.

SUMMARY

One embodiment includes a signal detector system. The system includes a power detector configured to convert an AC signal to a DC signal corresponding to a power amplitude associated with the AC signal. The AC signal can include a periodic signal power null. The system also includes a null-gating circuit comprising a logic switch that is activated to enable sampling of an amplitude of the DC signal via the switch, the logic switch being deactivated during the periodic signal power null. The system also includes an analog-to-digital converter (ADC) configured to convert the sampled DC signal to a digital signal. The system further includes a processor configured to process the digital signal.

Another embodiment includes method for demodulating an RF signal. The method includes receiving an RF signal at an antenna, the RF signal having a period that comprises a signal power null. The method also includes converting the RF signal to a DC signal corresponding to a power amplitude associated with the RF signal. The method also includes activating a logic switch to enable sampling of an amplitude of the DC signal, and deactivating the logic switch during the periodic signal power null in response to a gate pulse signal having a predetermined pulse width. The method further includes converting the amplitude of the sampled DC signal to a digital signal.

Another embodiment includes an RF receiver system. The system includes a power detector configured to convert a received RF signal to a DC signal corresponding to a power amplitude associated with the received RF signal. The received RF signal can be a periodic signal having a substantial power null. A null-gating circuit can include a logic switch that is activated to enable sampling of an amplitude of the DC signal at an output of the logic switch and that is deactivated during the power null of the periodic signal in response to a gate pulse signal having a predetermined pulse width that is gated based on the DC signal. The null-gating circuit can also be configured to substantially hold an average of the DC signal sampled at the output of the logic switch during the power null of the periodic signal. An analog-to-digital converter (ADC) can be configured to convert the average of the sampled DC signal to a corresponding digital signal, and a processor can be configured to process the digital signal.

DETAILED DESCRIPTION

This disclosure relates generally to network and computer systems, and specifically to a system and method to provide null-gating signal detection. A signal detector system can receive an AC signal, which could be an RF signal that is received at an antenna. The RF signal can be a cyclic signal that includes a periodic power null. As an example, the AC signal could be a signal that includes a digital broadcast modulation scheme that implements the cyclic null in a carrier, such as the Digital Audio Broadcast (DAB) signal standard. The signal detector system can include an RMS-to-DC converter that is configured to convert the AC signal to a DC signal that is indicative of the signal power of the received AC signal. Thus, the periodic power null will be present in the DC signal.

The signal detector system includes a null-gating circuit that is configured to provide a power level of the DC signal at an output, accounting for the periodic signal power null. The null-gating circuit can include a logic switch that is activated to enable sampling of the DC signal and is selectively deactivated during the periodic power null. Therefore, the indication of the power of the DC signal, thus corresponding to the power of the received AC signal, can be processed without the effect of the periodic signal power null. The logic switch can be controlled via a gate pulse signal having a predetermined pulse width, which can be gated to the DC signal that includes the null. To generate the gate pulse signal, the null-gating circuit can include a comparator configured to compare the DC signal with a predetermined reference voltage, which can be a programmable voltage. As an example, the predetermined reference voltage can have an amplitude that is less than an acceptable range of data-encoded power for the received AC signal, and can thus be indicative of the periodic signal power null. The signal detector system can also include a delay circuit that is configured to delay a rising edge corresponding to an end of a periodic signal power null, as indicated by the comparator. The delayed rising edge can be provided to a pulse generator that can generate the gate pulse trigger signal that can deactivate the logic switch to gate the DC signal.

As an example, the predetermined pulse width of the gate pulse signal can be greater than and aligned with the periodic signal power null. Additionally, a time duration that is approximately equal to a sum of the predetermined pulse width and the predetermined delay time of the delay circuit can be greater than a time duration associated with a period of the AC signal comprising the periodic signal power null. Therefore, the gate pulse signal can deactivate the logic switch prior to the beginning of the periodic signal power null in a given period of the AC signal, and can reactivate the logic switch at a time subsequent to the periodic signal power null. The output of the logic switch can be coupled to a filter (e.g., an RC filter) to sample the gated DC signal during activation of the logic switch. The null-gating circuit can further include an operational amplifier (OP-AMP) that is configured as a low input bias buffer to provide the sampled DC signal in a substantially stable manner at an output of the null-gating circuit. Thus, the sampled DC signal can be provided to an analog-to-digital converter (ADC) for subsequent processing.

Figure 1:
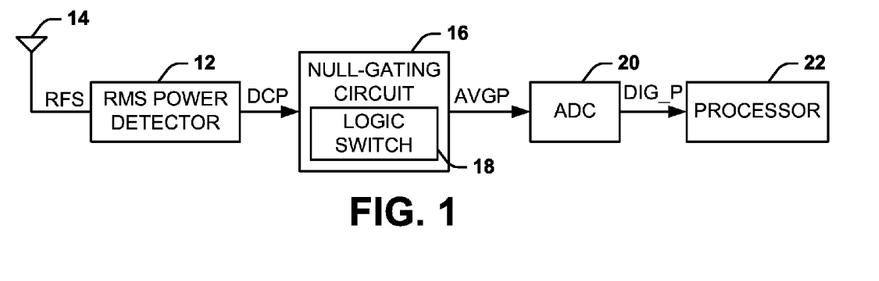
FIG. 1 illustrates an example of a gating signal detector system.

FIG. 1 illustrates an example of a gating signal detector system 10. The gating signal detector system 10 can be implemented in a variety of receiver systems, such as an RF receiver in a digital modulation signal receiver system. For example, the gating signal detector system 10 can be configured to receive RF signals transmitted according to the DAB standard.

The gating signal detector system 10 includes a root-mean-square (RMS) power detector 12 that is configured to receive an AC signal and to generate a corresponding DC power signal DCP having a value that indicates a power of the AC signal. In the example of FIG. 1, the AC signal is demonstrated as a radio frequency (RF) signal RFS that is received at an antenna 14. However, it is to be understood that the RMS power detector 12 can receive any of a variety of AC signals via any of a variety of types of media (e.g., wired or wireless). The signal RFS can have a modulation scheme that includes a periodic signal power null, such that the periodic signal power null can be included in each period of the signal RFS.

Figure 2:
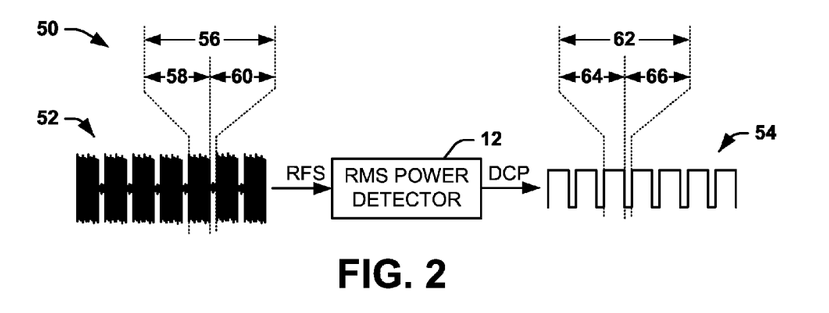
FIG. 2 illustrates an example diagram of power detection.

FIG. 2 illustrates an example diagram 50 of power detection. The diagram 50 includes the RMS power detector 12 converting the signal RFS, demonstrated in the example of FIG. 2 at 52, into the DC signal DCP, demonstrated in the example of FIG. 2 at 54. The diagram 50 demonstrates a period 56 of the signal RFS, with each period 56 including a data portion 58 and a periodic signal power null portion 60. The data portion 58 is thus demonstrated as having a relatively high AC signal amplitude and the periodic signal power null portion 60 is thus demonstrated as having an AC signal amplitude that is close to zero volts. Similarly, the diagram 50 demonstrates a corresponding period 62 of the DC signal DCP, with each period 62 including a data portion 64 and a signal power null portion 66. The data portion 64 is thus demonstrated as having a relatively high DC signal amplitude and the signal power null portion 66 is thus demonstrated as having a DC signal amplitude that is approximately at or close to zero volts. It is to be understood that, while each period 62 of the DC signal DCP is demonstrated as having approximately the same amplitude in each data portion 64, the data portion 64 of each period 62 can vary based on the signal characteristics associated with the data portion 58 in each period 56 of the received signal RFS.

Referring back to the example of FIG. 1, the gating signal detector system 10 also includes a null-gating circuit 16. The null-gating circuit 16 is configured to provide a signal AVGP that corresponds to an average power level of the DC signal DCP absent the periodic signal power null. In other words, the null-gating circuit 16 is configured to sample the DC signal DCP in a manner that omits the decrease in power associated with the periodic signal power null. In the example of FIG. 1, the null-gating circuit 16 includes a logic switch 18 that is activated to enable sampling of the DC signal DCP and is deactivated during the periodic signal power null, such that the DC signal DCP is not sampled during the periodic signal power null (e.g., during the signal power null portion 66 of the DC signal DCP). As an example, the null-gating circuit 16 can be configured to generate a gate pulse signal that controls (e.g., deactivates) the logic switch 18 during a predetermined pulse width of the gate pulse signal. The gate pulse signal can be generated based on a comparison of the amplitude of the DC signal DCP with a predetermined reference voltage to detect the periodic signal power null, and can delay a rising-edge associated with an end of a periodic signal power null to generate the gate pulse signal. As a result, the gate pulse signal can deactivate the logic switch 18 at a time just prior to the periodic signal power null in the next period of the signal RFS, and thus the next period of the DC signal DCP.

The sampled DC signal DCP can be provided at an output of the null-gating circuit 16 as an average power level of the DC signal DCP via the signal AVGP. As an example, the null-gating circuit 16 can include an operational amplifier (OP-AMP) that is configured as a low input bias buffer that provides the sampled DC signal DCP as the signal AVGP. The signal AVGP is provided to an analog-to-digital converter (ADC) 20 that converts the signal AVGP to a digital signal DIG_P. The digital signal DIG_P is provided to a processor 22 that can thus process the digital signal DIG_P. For example, the processor 22 can control a gain of the associated power control loop, demodulate the signal RFS, or can implement a variety of other features based on processing the digital signal DIG_P.

Figure 3:
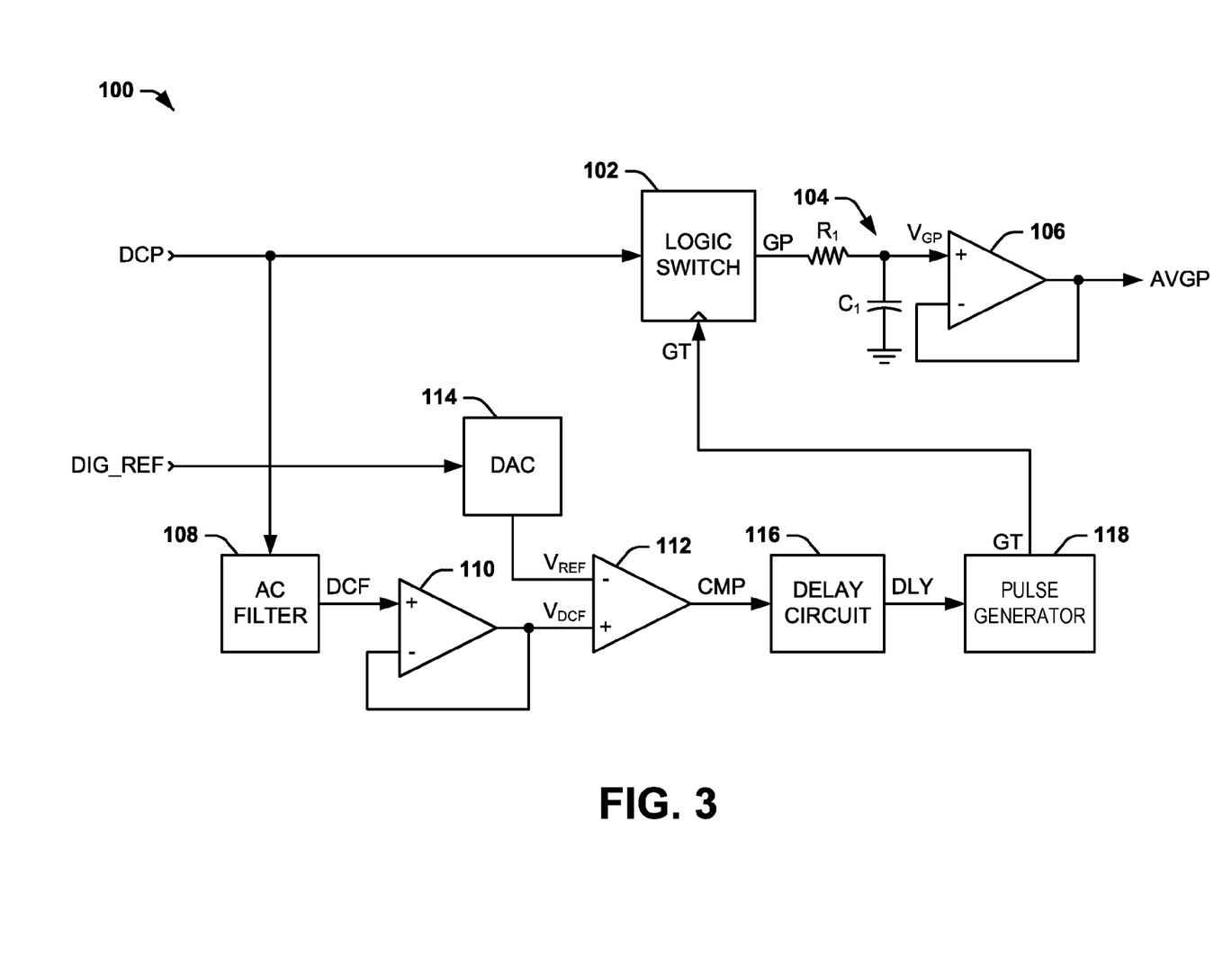
FIG. 3 illustrates an example of a null-gating circuit.

FIG. 3 illustrates an example of a null-gating circuit 100. The null-gating circuit 100 can correspond to the null-gating circuit 16 in the example of FIG. 1. Thus, reference can be made to the example of FIG. 1 in the following description of the example of FIG. 3 for additional context.

The null-gating circuit 100 receives the DC signal DCP (e.g., from RMS power detector 12) and is configured to provide the signal AVGP that corresponds to the average power level of the DC signal DCP absent the periodic signal power null. The null-gating circuit 100 includes a logic switch 102 that is normally held in an activated state to enable sampling of the DC signal DCP. As an example, the logic switch 102 can be configured as a transistor (e.g., complementary metal-oxide semiconductor (CMOS)) switch device, a sample and hold circuit, latch or other logic switching device. In the example of FIG. 3, the logic switch 102 provides the DC signal DCP, demonstrated as a signal GP, at an output thereof while activated. The logic switch 102 is normally activated and is deactivated in response to a gate pulse signal GT having a predetermined pulse width during the periodic signal power null (e.g., during the signal power null portion 66 of the DC signal DCP). The logic switch 102 thus gates the DC signal DCP during the periodic signal power null, such that the signal GP is not passed to the output during the periodic signal power null. Instead, the logic switch 102 samples the DC signal DCP during the non-null (e.g., stable) portion of the signal DCP. As an example, the predetermined pulse width of the gate pulse signal GT can have a time duration that is approximately twice the duration of the periodic signal power null to help ensure that the logic switch is deactivated during the null.

The signal GP is provided to an RC filter that includes a resistor $R_1$ and a capacitor $C_1$. The RC filter can be configured with a time constant to smooth the signal GP without introducing excessive time delay. In the example of FIG. 3, the resistor $R_1$ interconnects the output of the logic switch 102 and a node 104, and the capacitor $C_1$ interconnects the node 104 and a low-voltage rail, demonstrated in the example of FIG. 3 as ground. Thus, the capacitor $C_1$ samples the signal GP as a voltage $V_{GP}$. The null-gating circuit 100 also includes an OP-AMP 106 that provides the voltage $V_{GP}$ as the signal AVGP corresponding to the average power level of the DC signal DCP. As an example, the OP-AMP 106 can be configured as a low input bias buffer, such that the OP-AMP 106 includes an inverting input that is coupled to the output on which the signal AVGP is provided, and the node 104 is coupled to a non-inverting input of the OP-AMP 106. Because of the low input bias of the OP-AMP 106, and because the logic switch 102 can have a low off-state leakage current, the capacitor $C_1$ has a substantially very small discharge current path. Therefore, the voltage $V_{GP}$ can be held at a substantially constant amplitude during the off-state of the logic switch 102 (e.g., during application of the gate pulse signal GT). Accordingly, the OP-AMP 106 can provide the signal AVGP as a buffered version of the voltage $V_{GP}$ corresponding to the average power of the DC signal DCP absent the periodic signal power null (e.g., during the non-null portion of signal DCP).

The null-gating circuit 100 also includes an AC filter 108, which can be a low-pass filter that is configured to remove any potential high frequency components from the DC signal DCP. As an example, the AC filter 108 can be configured to allow for a rise/fall time that is insignificant with respect to the duration of the periodic signal power null. For example, the AC filter 108 can have a corner frequency bandwidth of 3 dB (e.g., a 1 MHz filter), such that a 0.35 microsecond rise time is insignificant relative to 1 millisecond periodic signal power null in a 100 millisecond period of the signal DCP. The filtered version of the DC signal DCP, demonstrated as a signal DCF, is provided to an OP-AMP 110. The OP-AMP 110 is demonstrated as being configured as a buffer, such that the OP-AMP 110 includes an inverting input that is coupled to a respective output and the signal DCF is received at a non-inverting input of the OP-AMP 110. The OP-AMP 110 thus outputs a voltage $V_{DCF}$ that is provided to a non-inverting input of a comparator 112. The comparator 112 is configured to compare the voltage $V_{DCF}$ with a predetermined reference voltage $V_{REF}$.

In the example of FIG. 3, the reference voltage $V_{REF}$ is generated via a digital-to-analog converter (DAC) 114 that is provided a signal DIG_REF corresponding to a programmable digital reference value. Thus, the reference voltage $V_{REF}$ can be programmable to provide for greater operational flexibility of the null-gating circuit 100. For example, the amplitude of the reference voltage $V_{REF}$ can be set for a no-signal condition (e.g., no presence of the AC signal RFS) plus a confidence margin, such that the dynamic range of the comparator 112 is optimized. Alternatively, the reference voltage $V_{REF}$ can be provided as a fixed analog voltage. For example, the reference voltage $V_{REF}$ can be selected as a voltage that is less than a corresponding operational power range for the transmitter that provides the AC signal RFS, but greater than a noise floor associated with the AC signal RFS, and is thus indicative of the periodic signal power null.

The comparator 112 is thus configured to compare the voltage $V_{DCF}$ with the predetermined reference voltage $V_{REF}$ to determine the occurrence of the periodic signal power null. In the example of FIG. 3, the comparator 112 provides a signal CMP that has a logic-low state during the signal power null portion 66 of the period 62 of the DC signal DCP, and a logic-high state during the data portion 64 of the period 62 of the DC signal DCP, as provided by the voltage $V_{DCF}$. While the null-gating circuit 100 is demonstrated in the example of FIG. 3 as including only a single comparator 112, it is to be understood that the null-gating circuit 100 could implement multiple comparators, such as a comparator to compare the voltage $V_{DCF}$ with a predetermined high reference voltage and another to compare with a predetermined low reference voltage. As an example, the predetermined high and low reference voltages could each be separately programmable. Thus, the comparator(s) 112 can provide a number of flexible options for detecting the periodic signal power null and for gating the logic switch 102 based on the periodic signal power null, as disclosed herein.

The signal CMP is provided to a delay circuit 116 that can be configured to provide an edge-triggered delay of the signal CMP, demonstrated as a delay signal DLY. For example, the delay circuit 116 can be configured to delay a rising and/or falling-edge of the signal CMP as the delay signal DLY in response to a logic-state of the signal CMP being maintained for a predetermined delay time, and can reset a state of the delay signal DLY in response to a change of state of the signal CMP before the expiration of the predetermined delay time. The predetermined delay time can be longer in time duration than the periodic signal power null, and can be, for example, a time duration that is slightly less than the data portion 64 of the period 62 of the DC signal DCP. Where the rising edge of the null is used to trigger the delay generator, for example, the delay generator can be configured to delay this rising edge by: [(Null Period)–(Null Width/2)]. At the end of this delay period, if the input to the delay circuit 116 is still at the state of the transition which triggered it (i.e., if rising edge, the level must still be a logic-high and vice-versa), then it will transition its own output to trigger the pulse generator 118. Therefore, the delay circuit 116 can be configured to delay a rising-edge of the signal CMP, thus corresponding to an end of the periodic signal power null, to assert the delay signal DLY after the predetermined delay time at a time that is less than the data portion 64 of the period 62 of the DC signal DCP, and can reset (e.g., de-assert) the delay signal DLY in response to a next rising-edge of the signal CMP.

The null-gating circuit 100 also includes a pulse generator 118 that is configured to generate the gate pulse signal GT in response to the rising-edge of the delay signal DLY. As disclosed herein, the gate pulse signal GT deactivates the logic switch 102. While deactivated, the sampled DCP signal provided at the output of the logic switch 102 the signal GP—can be held substantially at the node by the filter (e.g., $R_1$ and $C_1$) during the null. The AC filter 108, buffer 110, comparator 112, DAC 114, delay circuit 116 and pulse generator 118 thus can collectively provide a corresponding control circuit configured to autonomously control the logic switch 102 (e.g., be self-gating) in response to the signal DCP, as disclosed herein.

As an example, the pulse generator 118 can be configured as a one-shot pulse generator, such that the gate pulse signal GT has a predetermined pulse width that is set to be greater than a time duration of the periodic signal power null. The predetermined pulse-width can be chosen based on a worst-case scenario with respect to component variation (e.g., based on fabrication tolerances) of the delay circuit 116 and the pulse generator 118, such that the predetermined pulse-width remains as enveloping the periodic signal power null during such worst-case scenario. For example, the predetermined pulse width can have a time duration that is approximately twice a duration of the periodic signal power null. As an example, a sum of the time duration of the predetermined delay time provided by the delay circuit 116 and the predetermined pulse width of the gate pulse signal GT can be greater than a time duration of the period 62 of the DC signal DCP. As a result, based on the timing of the delay circuit 116 with respect to the predetermined delay time, the gate pulse signal GT can be provided before the beginning of the signal power null portion 66 of the period 62 of the DC signal DCP, and can end after the end of the signal power null portion 66 of the period 62 of the DC signal DCP. Stated differently, with the delay being set to be slightly shorter (e.g., by half the null width) than the repetition period and the width of the gate pulse signal GT twice that of the null, a window of the gate pulse signal GT can completely encompass the null in the DC signal DCP.

As a result of the operation of the null-gating circuit 100 with respect to the gate pulse signal GT deactivating the logic switch 102 during the periodic signal power null, the signal GP provided by the logic switch 102 can be provided despite the decrease in power associated with the periodic signal power null, as described herein. Therefore, the gating signal detector system 10 in the example of FIG. 1 can achieve average power detection of the AC signal RFS absent the periodic signal power null without introducing lag or delays in an associated power detection loop. As an example, the response time of the power control loop of the gating signal detector system 10 is not subjected to a slow response time, such as can occur in typical power detection circuits that implement RC filtering using a long time constant to average the power of the AC signal RFS. As another example, the gating signal power detection circuit does not experience additional overhead and lag in the response time, such as can occur in typical power detection circuits that implement digital averaging of ADC samples of the AC signal RFS power (e.g., via a microcontroller).

It is to be understood that the null-gating circuit 100 is not intended to be limited to that which is demonstrated in the example of FIG. 3. For example, at least a portion of the null-gating circuit 100 can be implemented digitally. As an example, the delay circuit 116 and the pulse generator 118 can be implemented as or as part of a microcontroller or a programmable logic device. Such a microcontroller or programmable logic device could likewise be configured to control the comparison of the voltage $V_{DCF}$ with the reference voltage $V_{REF}$, and can be implemented to program the reference voltage $V_{REF}$. Additionally, the null-gating circuit 100 can implement multiple comparators for comparing the voltage $V_{DCF}$ with respective multiple reference voltages $V_{REF}$, such as to detect both a rising-edge and a falling-edge of the voltage $V_{DCF}$. Therefore, the multiple comparators can provide for a more flexible interface (e.g., to a logic controller) and can provide for a more simplistic pulse-width measurement. Therefore, the null-gating circuit 100 can be configured in a variety of ways.

Figure 4:
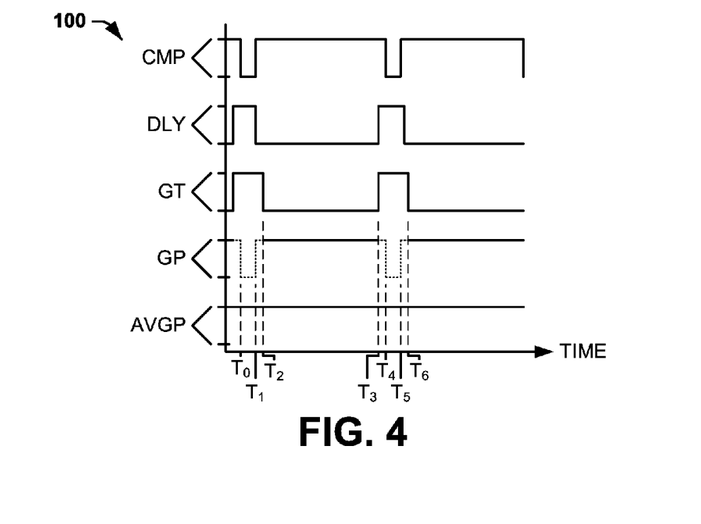
FIG. 4 illustrates an example of a timing diagram.

FIG. 4 illustrates an example of a timing diagram 150. The timing diagram 150 can be associated with the signals demonstrated in the example of FIG. 3. In the example of FIG. 4, the timing diagram 150 includes the signal CMP, the delay signal DLY, the gate pulse signal GT, the signal GP provided at the output of the logic switch 102, and the signal AVGP provided by the OP-AMP 106 that is associated with a time-average of the power of the DC signal DCP absent the periodic signal power null.

At a time $T_0$, the signal CMP switches to a logic-low state, thus indicating the beginning of a periodic signal power null of the DC signal DCP. The signal CMP can be substantially similar to the DC signal DCP, such that the signal CMP has a logic-low state during the signal power null portion 66 of the period 62 of the DC signal DCP and a logic-high state during the data portion 64 of the period 62 of the DC signal DCP. At the time $T_0$, the delay signal DLY and the gate pulse signal GT are each logic-high. Therefore, the logic switch 102 is deactivated at the time $T_0$ such that the signal DCP is not provided through the logic switch to the output of the logic switch 102. At the time $T_0$, the signal GP is demonstrated as a dashed line that approximates the DC signal DCP, thus demonstrating the portion of the DC signal DCP that is not being sampled via the capacitor $C_1$. Also during the time $T_0$, the capacitor $C_1$ approximately holds the amplitude of the voltage $V_{GP}$ based on substantially no discharge of the capacitor $C_1$. Thus, the signal AVGP corresponding to the average of the signal GP maintains a substantially constant amplitude even during the period of deactivation of the logic switch 102.

At a time $T_1$, the signal CMP is asserted to a logic-high state, thus indicating the end of the signal power null portion 66 of the period 62 of the DC signal DCP. In response, the delay signal DLY is de-asserted to a logic-low state. However, the delay circuit 116 is triggered based on the rising-edge of the signal CMP, thus beginning the predetermined delay time. At a time $T_2$, the gate pulse signal GT is de-asserted (e.g., at the end of the predetermined pulse width). Therefore, at time $T_2$, the logic switch 102 is activated to enable sampling of the DC signal DCP, such that the signal GP is provided at the output of the logic switch 102. At this time, the amplitude of the voltage $V_{GP}$ could change commensurate with the difference between signals DCP and GP when the switch is activated at $T_2$. In the example of FIG. 4, the amplitude of the signal AVGP is not demonstrated as changing at the time $T_2$. However, it is to be understood that the signal AVGP could change beginning at the time $T_2$, corresponding to reactivation of the logic switch 102, thus reflecting the change in power of the AC signal RFS indicated by the DC signal DCP.

At a time $T_3$, the predetermined delay time expires. As a result, because the signal CMP has held a logic-high state through the predetermined delay time, the delay signal DLY is asserted to a logic-high state. In response, the pulse generator 118 generates the gate pulse signal GT as a one-shot signal having a predetermined pulse width (e.g., twice a width of the periodic signal power null). Therefore, the logic switch 102 is deactivated to disable sampling of the DC signal DCP. Thus, the signal DCP is not provided through the logic switch 102 to the signal at the output of the logic switch beginning at the time $T_3$, and the signal AVGP substantially holds its respective amplitude. At a time $T_4$, the signal CMP switches to a logic-low state, thus indicating the beginning of a periodic signal power null of the DC signal DCP. However, because the gate pulse signal GT had been asserted at the time $T_3$ prior to the time $T_4$, the reduced power of the DC signal DCP during such null is not sampled via the signal GP, and thus the signal AVGP does not reflect a reduced average power resulting from the periodic signal power null of the DC signal DCP.

At a time $T_5$, the signal CMP is asserted to a logic-high state, thus indicating the end of the signal power null portion 66 of the period 62 of the DC signal DCP. In response, the delay signal DLY is de-asserted to a logic-low state. The delay circuit 116 is again triggered based on the rising-edge of the signal CMP, thus beginning the predetermined delay time again. At a time $T_6$, the gate pulse signal GT is de-asserted at the end of the predetermined pulse width. Therefore, the logic switch 102 is again activated to enable sampling of the DC signal DCP. Thus, the signal DCP is sampled through the switch as the signal GP at the output of the logic switch 102 beginning at the time $T_6$. At this time, the amplitude of the signal AVGP could again change based on a difference in power indicated by the DC signal DCP and the signal at GP. At a subsequent time, the predetermined delay time of the delay circuit 116 will again expire, thus repeating the cycle from the times $T_2$ through $T_6$ based on the DC signal DCP. Accordingly, the signal AVGP is provided as an average power of the DC signal DCP absent the periodic signal power null.

Figure 5:
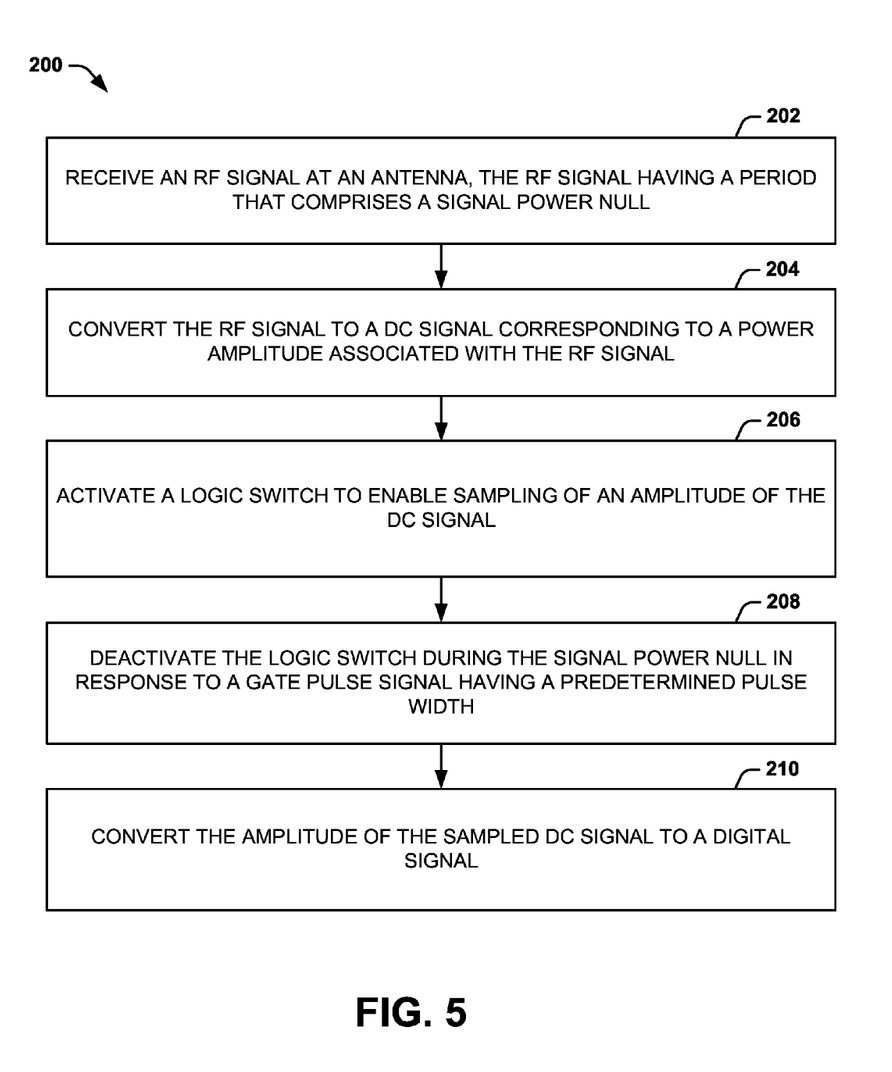
FIG. 5 illustrates an example of a method for signal detection.

In view of the foregoing structural and functional features described above, an example method will be better appreciated with reference to FIG. 5. While, for purposes of simplicity of explanation, the method of FIG. 5 is shown and described as executing serially, it is to be understood and appreciated that the method is not limited by the illustrated order, as some aspects could, in other embodiments, occur in different orders and/or concurrently with other aspects from that shown and described herein. Moreover, not all illustrated features may be required to implement a method. The method of FIG. 5 can be implemented by hardware, such as can include a microcontroller, discrete circuit components, an integrated circuit or a combination of discrete components and integrated circuitry (e.g., residing in a DAB receiver).

FIG. 5 illustrates an example of a method 200 for signal detection. At 202, an RF signal is received at an antenna. The RF signal can have a period that comprises a signal power null, such that the signal power null can be periodic. At 204, the RF signal is converted (e.g., by RMS power detector 12 of FIG. 1) to a DC signal corresponding to a power amplitude associated with the RF signal. The DC signal can include the signal power null in each period of the DC signal. At 206, a logic switch (e.g., switch 18 of FIG. 1 or switch 102 of FIG. 3) is activated to enable sampling of the amplitude of the DC signal. The sampling of the amplitude of the DC signal can be performed via an RC filter (e.g., via $R_1$ and $C_1$ of FIG. 3), such that the amplitude of the DC signal is sampled onto a capacitor via the logic switch. The sampled DC signal thus can be provided as an average power signal via an OP-AMP (e.g., buffer 106 of FIG. 3) that is configured as a low input bias buffer.

At 208, the logic switch can deactivated during the signal power null in response to a gate pulse signal having a predetermined pulse width. The sampled DC signal can be held at a substantially constant sampled value (e.g., via capacitor $C_1$ that has substantially very little current discharge path). The gate pulse signal can be generated via at least one comparator (e.g., comparator 112 of FIG. 3) that is configured compare the DC signal to a predetermined reference voltage, such as programmable via a DAC or other reference source. The comparator output can be delayed (e.g., at a rising-edge by delay circuit 116), such that the delayed rising-edge can trigger a pulse generator (e.g., pulse generator 118) to provide the logic switch a signal pulse (e.g., a one-shot pulse corresponding to the gate pulse signal). The predetermined pulse width of the gate pulse signal can be greater than the signal power null, such that the gate pulse signal can deactivate the logic switch prior to a beginning of the power signal null, and can reactivate the logic switch subsequent to an end of the power signal null. At 210, the amplitude of the sampled DC signal can be converted to a digital signal. The conversion of the sampled DC signal to the digital signal can occur via an ADC (e.g., ADC 20 of FIG. 1), such that the digital signal can be provided to a processor for further processing, such as in an associated power control loop of a receiver.

In view of the foregoing, the systems and methods disclosed herein can yield a stability of power reading equaling or surpassing that of heavy hardware or software filtering/averaging, but without the penalty of feedback time delay or processing overhead typically associated with such systems. Further, the approach disclosed herein can be made completely adaptable to different modulation schemes. As a result, the approach disclosed herein can achieve the stability of a heavily averaged sample, without the penalty to system response time.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A signal detector system comprising:
a power detector configured to convert an AC signal to a DC signal corresponding to a power amplitude associated with the AC signal, the AC signal comprising a periodic signal power null;
a null-gating circuit comprising a logic switch that is activated to enable sampling of the DC signal via the logic switch to provide the DC signal as a sampled DC signal, the logic switch being deactivated during the periodic signal power null; and
an analog-to-digital converter (ADC) configured to convert the sampled DC signal to a digital signal for subsequent processing.

2. The system of claim 1, wherein the null-gating circuit further comprises a comparator configured to compare an amplitude of the DC signal with a predetermined reference voltage and to provide a comparison signal, which indicates the periodic signal power null, in response to the amplitude of the DC signal being less than the predetermined reference voltage.

3. The system of claim 2, wherein the predetermined reference voltage is a programmable voltage.

4. The system of claim 2, wherein the null-gating circuit further comprises a delay circuit that is configured to assert a delay signal for a predetermined delay time in response to the comparison signal being asserted, the delay signal being asserted to trigger activation of the logic switch.

5. The system of claim 4, wherein the null-gating circuit further comprises a pulse generator configured to generate a gate pulse signal in response to the delay signal, the gate pulse signal having a predetermined pulse width and being provided to deactivate the logic switch for a duration that corresponds to the predetermined pulse width.

6. The system of claim 5, wherein the predetermined pulse width of the gate pulse signal is greater than a width of the periodic signal power null.

7. The system of claim 6, wherein a time duration approximately equal to a sum of the predetermined pulse width and the predetermined delay time is greater than a time duration of a period of the AC signal comprising the periodic signal power null.

8. The system of claim 1, wherein the null-gating circuit further comprises a filter at an output of the logic switch, the filter being configured to sample the DC signal.

9. The system of claim 8, wherein the null-gating circuit further comprises an operational amplifier (OP-AMP) configured as a low input bias buffer to substantially hold a magnitude of the sampled DC signal at an output thereof that is provided to the ADC.

10. An RF receiver comprising the circuit system of claim 1, wherein the AC signal is an RF signal received at an antenna.

11. A method comprising:
receiving an RF signal at an antenna, the RF signal having a period comprising a data portion and a signal power null;

converting the RF signal to a DC signal having a power amplitude that varies between the data portion and the signal power null;

activating a logic switch to enable sampling of an amplitude of the DC signal provided at an output of the logic switch;

deactivating the logic switch during the signal power null in response to a gate pulse signal having a predetermined pulse width; and converting the amplitude of the sampled DC signal to a corresponding digital signal.

12. The method of claim 11, further comprising:

comparing the amplitude of the DC signal relative to a programmable reference voltage to generate a rising-edge signal;

delaying the rising-edge signal by a predetermined delay time to generate a delay signal; and generating the gate pulse signal in response to the delay signal such that the gate pulse signal is aligned with and encompasses the signal power null.

13. The method of claim 12, wherein generating the gate pulse signal comprises generating the gate pulse signal with the predetermined pulse width that is greater than a width of the signal power null.

14. The method of claim 12, wherein delaying the rising-edge signal comprises delaying the rising-edge signal such that a time duration approximately equal to a sum of the predetermined pulse width and the predetermined delay time is greater than a time duration associated with the period of the RF signal.

15. The method of claim 11, further comprising:

charging a capacitor to sample the amplitude of the DC signal via the logic switch during activation of the logic switch; and providing and substantially holding a magnitude of the sampled DC signal at an output of an operational amplifier (OP-AMP), the OP-AMP configured as a low input bias buffer.

16. An RF receiver system comprising:

a power detector configured to convert a received RF signal to a DC signal corresponding to a power amplitude associated with the received RF signal, the received RF signal comprising a periodic signal having a substantial power null;

a null-gating circuit comprising a logic switch that is activated to enable sampling of an amplitude of the DC signal at an output of the logic switch and that is deactivated during the power null of the periodic signal in response to a gate pulse signal having a predetermined pulse width that is gated based on the DC signal;

the null-gating circuit being configured to substantially hold an average of the DC signal sampled at the output of the logic switch during the power null of the periodic signal;

an analog-to-digital converter (ADC) configured to convert the average of the sampled DC signal to a corresponding digital signal; and a processor configured to process the digital signal.

17. The system of claim 16, wherein the null-gating circuit further comprises a comparator configured to compare the amplitude of the DC signal with at least one programmable reference voltage and to provide a comparison signal that is indicative of the periodic signal power null in response to the amplitude of the DC signal decreasing less than the programmable reference voltage.

18. The system of claim 17, wherein the null-gating circuit further comprises a delay circuit that is configured to receive the comparison signal and to assert a delay signal in response to the comparison signal being asserted for a predetermined delay time, the delay signal being asserted to activate the logic switch.

19. The system of claim 18, wherein the null-gating circuit further comprises a pulse generator configured to generate the gate pulse signal in response to the delay signal, wherein the predetermined pulse width is greater than a width of the periodic signal power null.

20. The system of claim 16, wherein the null-gating circuit further comprises:

a filter configured to filter the sampled DC signal; and an operational amplifier (OP-AMP) configured as a low input bias buffer to provide the average of the sampled DC signal to the ADC based on the filtered DC signal.

* * * * *